(12) United States Patent
Zhang

(10) Patent No.: US 8,541,787 B2
(45) Date of Patent: Sep. 24, 2013

(54) HIGH BREAKDOWN VOLTAGE WIDE BAND-GAP MOS-GATED BIPOLAR JUNCTION TRANSISTORS WITH AVALANCHE CAPABILITY

(75) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 298 days.

(21) Appl. No.: 12/503,430

(22) Filed: Jul. 15, 2009

(65) Prior Publication Data
US 2011/0012130 A1    Jan. 20, 2011

(51) Int. Cl.
    *H01L 29/739*    (2006.01)
(52) U.S. Cl.
    USPC ...... 257/77; 257/139; 257/133; 257/E29.104; 257/E29.197
(58) Field of Classification Search
    USPC ............ 257/77, 139, E29.104, E29.197; 438/268
    See application file for complete search history.

(56) References Cited

U.S. PATENT DOCUMENTS

| | | |
|---|---|---|
| 3,439,189 A | 4/1969 | R.E. Petry |
| 3,629,011 A | 12/1971 | Tohi et al. |
| 3,758,831 A * | 9/1973 | Clark ............................ 257/497 |
| 3,924,024 A | 12/1975 | Naber et al. |
| 4,160,920 A | 7/1979 | Courier de Mere |
| 4,242,690 A | 12/1980 | Temple |
| 4,466,172 A | 8/1984 | Batra |
| 4,500,902 A * | 2/1985 | Herberg ........................ 257/137 |
| 4,581,542 A | 4/1986 | Steigerwald |
| 4,644,637 A | 2/1987 | Temple |
| 4,811,065 A | 3/1989 | Cogan |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |

(Continued)

FOREIGN PATENT DOCUMENTS

| | | |
|---|---|---|
| DE | 39 42 640 A1 | 8/1990 |
| DE | 198 09 554 | 9/1998 |

(Continued)

OTHER PUBLICATIONS

Yi Tang, Sujit Banerjee and T. Paul Chow, Hybrid All-SiC MOS-Gated Bipolar Transistor (MGT), Proceedings of the 14th International Symposium on Power Semiconductor Devices and ICs, 2002.*

(Continued)

*Primary Examiner* — Thao Le
*Assistant Examiner* — Sheng Zhu
(74) *Attorney, Agent, or Firm* — Myers Bigel Sibley & Sajovec, P.A.

(57) ABSTRACT

High power wide band-gap MOSFET-gated bipolar junction transistors ("MGT") are provided that include a first wide band-gap bipolar junction transistor ("BJT") having a first collector, a first emitter and a first base, a wide band-gap MOSFET having a source region that is configured to provide a current to the base of the first wide band-gap BJT and a second wide band-gap BJT having a second collector that is electrically connected to the first collector, a second emitter that is electrically connected to the first emitter, and a second base that is electrically connected to the first base.

25 Claims, 6 Drawing Sheets

(56) References Cited

U.S. PATENT DOCUMENTS

| | | |
|---|---|---|
| 5,111,253 A | 5/1992 | Korman et al. |
| 5,141,889 A * | 8/1992 | Terry et al. ............ 438/138 |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A * | 3/1995 | Baliga ............ 257/77 |
| 5,399,887 A | 3/1995 | Weitzel et al. |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A * | 4/1996 | Palmour ............ 257/77 |
| 5,510,281 A * | 4/1996 | Ghezzo et al. ............ 438/268 |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,608,237 A * | 3/1997 | Aizawa et al. ............ 257/132 |
| 5,623,151 A * | 4/1997 | Ajit ............ 257/212 |
| 5,629,531 A | 5/1997 | Palmour |
| 5,631,483 A * | 5/1997 | Ferla et al. ............ 257/341 |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A * | 10/1999 | Singh ............ 257/77 |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowsky et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,169,300 B1 * | 1/2001 | Fragapane ............ 257/146 |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,242,967 B1 * | 6/2001 | Iwamuro et al. ............ 327/432 |
| 6,246,076 B1 | 6/2001 | Lipkin et al. |
| 6,268,769 B1 * | 7/2001 | Yamauchi et al. ............ 330/255 |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,570,185 B1 | 5/2003 | Tan |
| 6,573,534 B1 | 6/2003 | Kumar et al. |
| 6,593,620 B1 | 7/2003 | Hshieh et al. |
| 6,600,192 B1 * | 7/2003 | Sugawara et al. ............ 257/329 |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B2 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,091,578 B2 * | 8/2006 | Park ............ 257/591 |
| 7,118,970 B2 | 10/2006 | Das et al. |
| 7,125,786 B2 | 10/2006 | Ring et al. |
| 7,221,010 B2 | 5/2007 | Ryu |
| 7,253,031 B2 | 8/2007 | Takahashi |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |

| Publication No. | Date | Inventor |
|---|---|---|
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0082116 A1 | 4/2004 | Kub et al. |
| 2004/0119076 A1 | 6/2004 | Ryu |
| 2004/0183079 A1 | 9/2004 | Kaneko et al. |
| 2004/0211980 A1 | 10/2004 | Ryu |
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0104072 A1 | 5/2005 | Slater, Jr. et al. |
| 2005/0139936 A1 | 6/2005 | Li |
| 2005/0151138 A1 | 7/2005 | Slater et al. |
| 2005/0181536 A1 | 8/2005 | Tsuji |
| 2005/0245034 A1 | 11/2005 | Fukuda |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0086997 A1 | 4/2006 | Kanaya et al. |
| 2006/0211210 A1 | 9/2006 | Bhat et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2007/0066039 A1 | 3/2007 | Agarwal et al. |
| 2007/0120148 A1 | 5/2007 | Nogome |
| 2007/0164321 A1 | 7/2007 | Sheppard |
| 2007/0241427 A1 | 10/2007 | Mochizuki et al. |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0105949 A1 | 5/2008 | Zhang et al. |
| 2008/0191304 A1 | 8/2008 | Zhang et al. |
| 2008/0230787 A1 | 9/2008 | Suzuki et al. |
| 2008/0251793 A1 | 10/2008 | Mazzola |
| 2008/0277669 A1 | 11/2008 | Okuno et al. |
| 2008/0296771 A1 | 12/2008 | Das et al. |
| 2009/0085064 A1 | 4/2009 | Rueb |
| 2009/0121319 A1 | 5/2009 | Zhang et al. |
| 2009/0212301 A1 | 8/2009 | Zhang et al. |
| 2009/0289262 A1 | 11/2009 | Zhang et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0244047 A1 | 9/2010 | Hull et al. |

FOREIGN PATENT DOCUMENTS

| | | |
|---|---|---|
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0 615 292 A1 | 3/1994 |
| EP | 0 615 292 A1 | 9/1994 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693 896 A1 | 8/2006 |
| EP | 1 806 787 A1 | 7/2007 |
| EP | 1 845 561 A2 | 10/2007 |
| EP | 2 015 364 | 1/2009 |
| JP | 60-240158 | 11/1985 |
| JP | 01117363 | 5/1989 |
| JP | 3 034466 A | 2/1991 |
| JP | 03034466 | 2/1991 |
| JP | 03157974 | 7/1991 |
| JP | 3-225870 | 10/1991 |
| JP | 5 029628 A | 2/1993 |
| JP | 08264766 | 10/1996 |
| JP | 9 129874 A | 5/1997 |
| JP | 09205202 | 8/1997 |
| JP | 9 326486 A | 12/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2000106371 A | 4/2001 |
| JP | 2002-314099 | 10/2002 |
| JP | 2005-167035 A | 6/2005 |
| JP | 2006-511961 A | 4/2006 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO 99/46809 | 9/1999 |
| WO | WO99/63591 A1 | 12/1999 |
| WO | WO 00/13236 A3 | 3/2000 |
| WO | WO 01/78134 A1 | 10/2001 |
| WO | WO 2004/020706 A1 | 3/2004 |
| WO | WO 2004/079789 A2 | 9/2004 |
| WO | WO 2005/020308 A1 | 3/2005 |
| WO | WO 2006/135031 A2 | 12/2006 |
| WO | WO 2007/040710 A1 | 4/2007 |

OTHER PUBLICATIONS

J. T. Richmond, S. Ryu, A.K. Agarwal and J.W. Palmour, "Hybrid 4H-SiC MOS Gated Transistor (MGT)" (admitted prior art).

Invitation to Pay Additional Fees and, Where Applicable, Protest Fee Corresponding to International Application No. PCT/US2010/034502; Date of Mailing: May 24, 2011; 8 Pages.

Ryu et al. "10 kV, 123 mΩ-cm<2>4H-SiC Power DMOSFETs" *Device Research Conference*, 2004. $62^{nd}$ DRC. Conference Digest, Jun. 21-23, 2004, Piscataway, NJ, USA, IEEE, Jun. 21, 2004, pp. 47-48. XP010748127.

Tang et al. "High-Voltage Implanted-Emitter 4H-SiC BJTS" *IEEE Electron Device Letters*, IEEE Service Center, New York, NY. vol. 23 No. 1. Jan. 1, 2002. XP001112376.

Tang et al. "Hybrid All-Sic MOS-Gated Bipolar Transistor (MGT)" *Proceedings of the $14^{th}$ International Symposium on Power Semiconductor Devices & ICS. ISPSD'02.* Santa Fe, NM Jun. 4-7, 2002; International Symposium on Power Semiconductor Devices & IC's, New York, NY: IEEE, Jun. 4, 2002, pp. 53-56. XP010591564.

Zhang et al. "A 10-kV Monolithic Darlington Transistor With β forced of 336 in 4H-SiC" *IEEE Electron Device Letters*, vol. 30, No. 2, pp. 142-144, Feb. 1, 2009, New York, NY. XP011240662.

International Search Report and Written Opinion of the International Searching Authority corresponding to International Application No. PCT/US2010/035709; Date of Mailing: Apr. 7, 2011; 12 pages.

"Insulated-gate bipolar transistor." *Wikipedia, the Free Encyclopedia*. Web. Jun. 21, 2010. http://en.wikipedia.org.

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N. S. Saks, S.S. Mani, V.S. Hegde and P.A. Sanger, "Investigation of Lateral Resurf, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PWS Publishing Company, Boston, MA. 426-502 (1996).

Baliga "Power MOSFET" *Power Semiconductor Devices*. PWS Publishing Company, Boston, MA 335-425 (1996).

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Buchner et al., "Laser Recrystallization of Polysilicon for Improved Device Quality", Springer Proceedings in Physics, vol. 35, Polycrystalline Semiconductors, pp. 289-294.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2$ O-annealed $SiO_2$ /SiC system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chen et al. "Theoretical Analysis of Current Crowding Effect in Metal/AlGaN/GaN Schottky Diodes and Its Reduction by Using Polysilicon in Anode, "Chin. Phys. Lett., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on $SiO_2$ /SiC Interface State Density for Nitrogen Doped 4H and 6H-SiC," *Materials Science Forum*. (2000) vols. 338-342, pp. 1097-1100.

International Search Report and Written Opinion for corresponding International Application No. PCT/US2004/004982, dated Jul. 22, 2004.

International Search Report for PCT/US01/30715.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2$ O", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. I, pp. 257-260 (Dec. 1985).

Fukuda et al. "Improvement of $SiO_2$ /4H-SiC Interface Using High-Temperature Hydrogen Annealing at Low Pressure and Vacuum Annealing," *Jpn J. Appl. Phys.* vol. 38, Apr. 1999, pp. 2306-2309.

Fukuda et al. "Improvement of $SiO_2$ /4H-SiC Interface by Using High Temperature Hydrogen Annealing at 1000° C," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion for PCT/US2010/025053 mailed on Jul. 2, 2010.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

Invitation to Pay Additional Fees for PCT/US2010/025053 mailed on May 3, 2010.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.T. Richmond, S. Ryu, A.K. Agarwal and J.W. Palmour, "Hybrid 4H-SiC MOS Gated Transistor (MGT)" (admitted prior art).

Jamet, et al. "Physical properties of $N_2$ O and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.

Kinoshita et al., "Guard Ring Assisted Resurf: A New Termination Structure Providing Stable and High Breakdown Voltage for SiC Power Devices, "Tech. Digest of ISPSD '02, pp. 253-256.

Kobayashi et al. "Dielectric Breakdown and Current Conduction of Oxide/Nitride/Oxide Multi-Layer Structures," *1990 IEEE Symposium on VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of $N_2$ O-Annealed $NH_3$ -Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Losee et al., "Degraded Blocking Performance of 4H-SiC Rectifiers Under High dV/dt Conditions", Proceedings of $17^{th}$ International Symposium on Power Semiconductor Devices & IC's, 4 pages (May 23-26, 2005). XP010820730.

Losee et al. "High-Voltage 4H-SiC PiN Rectifiers with Single-Implant, Multi-Zone JTE Termination", Power Semiconductor Devices and ICs, 2004 Proceedings. ISPSB '04. The $16^{th}$ International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$ ," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h-SiC" $7^{th}$ *European Conference on Silicon Carbide and Related Materials*, Barcelona-Spain, Sep. 7-11, 2008 retrieved from http://ecscrm08.com/invited_presentations. html , retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2$ 0): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$ /SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 2, 2010).

Panknin et al., "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271- 1274, 2000.

Rao et al. "Al and N Ion Implantations in 6H-Sic," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 mΩ-cm$^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze Semiconductor Devices, Physics and Technology. 2$^{nd}$ Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on (1120) Face*; Japanese Journal of Applied Physics, Japan Society of Applied Physics, Tokyo, JP; vol. 40, No. 11B, Part 2; Nov. 2001; pp. L1201-L1203.

Singh, R. and J.W. Palmour, "Planer Terminations in 4H-SiC Schottky Diodes with Low Leakage and High Yields, "IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/$SiO_2$ Interface States," *Phy. Stat. Sol. (a)*, vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide surfaces with graphite capping layer during post-implantation annealing, "Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/$SiO_2$ Interface with Nitric Oxide," *Materials Science Forum*. vols. 389-393 (2002), pp. 967-972.

Xu et al. "Improved Performance and Reliability of $N_2$ O-Grown Oxynitride on 6H-SiH," *IEEE Electron Device Letters*. vol. 21, No. 6, Jun. 2000, p. 298-300.

Y. Li et al., "High Voltage (3 kV) UMOSFETs in 4H-SiC," *Transactions on Electron Devices*, vol. 49, No. 6, Jun. 2002.

Y. Wang, C. Weitzel, and M. Bhatnagar, "Accumulation-Mode SiC Power MOSFET Design Issues," *Materials Science Forum*, Vols. 338-342, pp. 1287-1290.

Yilmaz, "Optimization and Surface Charge Sensitivity of High Voltage Blocking Structures with Shallow Junctions, "IEEE Transactions on Electron Devices, vol. 38, No. 3, Jul. 1991, pp. 1666-1675.

Zhang et al., "A 10-kV Monolithic Darlington Transistor with β forced of 336 in 4H-SiC," IEEE Electron Device Letters, vol. 30, No. 2, pp. 142-144, XP011240662.

Zhang et al.; *Design and Fabrications of High Voltage IGBTs on 4H-SiC*; 2006 IEEE Proceedings of the 18$^{th}$ International Symposium on Power Semiconductor Devices & ICs, Napels, Italy Jun. 4-8, 2006, pp. 1-4.

International Preliminary Report on Patentability Corresponding to PCT/US2010/035709; Date of Mailing: Dec. 15, 2011; 8 pages.

International Preliminary Report on Patentability Corresponding to PCT/US2010/035713; Date of Mailing: Dec. 15, 2011; 8 pages.

International Preliminary Report on Patentability Corresponding to PCT/US2010/034502; Date of Mailing: Jan. 26, 2012; 12 pages.

Yi Tang et al., "Hybrid All-Sic MOS-Gated Bipolar Transistor (MGT)", Proceedings of the 14$^{th}$ International Symposium on Power Semiconductor Devices & ICS. ISPSD'02. Santa Fe, NM, Jun. 4-7, 2002.

Tang Yet al., "High-Voltage Implanted-Emitter 4H-SIC BJTS," IEEE Electron Device Letters, IEEE Service Center. New York, NY US, vol. 23, No. 1, Jan. 1, 2002, pp. 16-18.

Sei-Hyung Ryu et al., "10 kV, 123 m/spl Omega/-cm 24H-SiC Power DMOSFETs," Device Research Conference, 2004, 62$^{nd}$ DRC. Conference Digest, Notre Dame, IN Jun. 23-23, 2004, Piscataway, NJ IEEE, Jun. 21, 2004.

Qingchun Zhang et al., "A 10-kV Monolithic Darlington Transistor With of 336 in 4H-SiC," IEEE Electron Device Letters, IEEE Service Center, New York, NY vol. 30, No. 2, Feb. 1, 2009, pp. 142-144.

International Search Report and the Written Opinion of the International Searching Authority Corresponding to International Application No. PCT/US2010/034502; Date of Mailing: Jul. 13, 2011; 17 pages.

European Second Examination Report Corresponding to European Patent Application No. 07120038; Dated: Apr. 15, 2013; 5 Pages.

\* cited by examiner

HIGH BREAKDOWN VOLTAGE WIDE BAND-GAP MOS-GATED BIPOLAR JUNCTION TRANSISTORS WITH AVALANCHE CAPABILITY

STATEMENT OF GOVERNMENT INTEREST

The present invention was developed with Government support under Army Research Laboratory Contract Nos. W911NF-04-2-0021 and W911NF-04-2-0022. The Government has certain rights in this invention.

FIELD OF THE INVENTION

The present invention relates to semiconductor devices and, more particularly, to high power silicon carbide based semiconductor devices.

BACKGROUND

Circuits in motor drives, appliance controls, robotics, lighting ballasts and other applications often require semiconductor switching devices that can carry large currents and support high blocking voltages. The bipolar junction transistor ("BJT") has been the switching device of choice for many high power applications because of its ability to handle relatively large output currents and support relatively high blocking voltages.

As is well known to those of skill in the art, a BJT is a three-terminal device constructed of a doped semiconductor material. A BJT includes two p-n junctions that are formed in close proximity to each other in a semiconductor material. In operation, charge carriers enter a first region of the semiconductor material (which is called the emitter) that is adjacent one of the p-n junctions. Most of the charge carriers exit the device from a second region of the semiconductor material (which is called the collector) that is adjacent the other p-n junction. The collector and emitter are formed in regions of the semiconductor material that have the same conductivity type. A third region of the semiconductor material, known as the base, is positioned between the collector and the emitter and has a conductivity type that is opposite the conductivity type of the collector and the emitter. Thus, the two p-n junctions of the BJT are formed where the collector meets the base and where the base meets the emitter. By flowing a small current through the base of a BJT, a proportionally larger current passes from the emitter to the collector.

A BJT may be a "PNP" device or an "NPN" device. In a PNP BJT, the emitter and collector are formed in p-type regions of the semiconductor material, and the base is formed in an n-type region of the semiconductor that is interposed between the two p-type regions. In an NPN BJT, the emitter and collector are formed in n-type regions of the semiconductor material, and the base is formed in an p-type region of the semiconductor that is interposed between the two n-type regions.

BJTs are current controlled devices in that a BJT is turned "on" (i.e., it is biased so that current flows from the emitter to the collector) by flowing a current through the base of the transistor. For example, in an NPN BJT, the transistor is typically turned on by applying a positive voltage to the base to forward bias the base-emitter p-n junction. When the device is biased in this manner, holes flow into the base of the transistor where they are injected into the emitter. The holes are referred to as "majority carriers" because the base is a p-type region, and holes are the normal charge carriers in such a region. At the same time, electrons are injected from the emitter into the base, where they diffuse toward the collector. These electrons are referred to as "minority carriers" because electrons are not the normal charge carrier in the p-type base region.

The base of the device is formed to be a relatively thin region in order to minimize the percentage of the minority carriers (i.e., the electrons injected into the base from the emitter) that recombine with the holes that flow from the base into the emitter. The collector-base p-n junction is reverse biased by applying a positive voltage to the collector. This facilitates sweeping the electrons that are injected from the emitter into the base to the collector. The device is referred to as a "bipolar" device because the emitter-collector current includes both electron and hole current. The current that flows into the base of the device controls the emitter-collector current.

Typically, a BJT may require a relatively large base current (e.g., one fifth to one tenth of the collector current) to maintain the device in its "on" state. As high power BJTs have large collector currents, they also typically have significant base current demands. Relatively complex external drive circuits may be required to supply the relatively large base currents that can be required by high power BJTs. These drive circuits are used to selectively provide a current to the base of the BJT that switches the transistor between its "on" and "off" states.

Power Metal Oxide Semiconductor Field Effect Transistors ("MOSFET") are another well known type of semiconductor transistor that may be used as a switching device in high power applications. A power MOSFET may be turned on or off by applying a gate bias voltage to a gate electrode of the device. For example, an n-type MOSFET turns on when a conductive n-type inversion layer is formed in a p-type channel region of the device in response to the application of a positive bias to the gate electrode. This inversion layer electrically connects the n-type source and drain regions and allows for majority carrier conduction therebetween.

The gate electrode of a power MOSFET is separated from the channel region by a thin insulating layer. Because the gate of the MOSFET is insulated from the channel region, minimal gate current is required to maintain the MOSFET in a conductive state or to switch the MOSFET between its on and off states. The gate current is kept small during switching because the gate forms a capacitor with the channel region. Thus, only minimal charging and discharging current ("displacement current") is required during switching, allowing for less complex gate drive circuitry. Moreover, because current conduction in the MOSFET occurs through majority carrier transport only, the delay associated with the recombination of excess minority carriers that occurs in BJTs is not present in MOSFET devices, allowing for switching speeds that can be orders of magnitude faster than that of BJTs. The drift region of a power MOSFET, however, may exhibit a relatively high on-resistance, which arises from the absence of minority carrier injection. As a result, the operating forward current density of a power MOSFET is typically limited to relatively low values as compared to power BJTs.

Devices embodying a combination of bipolar current conduction with MOS-controlled current flow are also known. One example of such a device is the Insulated Gate Bipolar Transistor ("IGBT"), which is a device that combines the high impedance gate of the power MOSFET with the small on-state conduction losses of the power BJT. Another device that combines MOSFET and BJT is the MOSFET Gated Transistor ("MGT"). An MGT may be implemented, for example, as a Darlington pair of discrete high voltage n-channel MOSFET at the input and a discrete BJT at the output. The MOSFET supplies the base current of the BJT while presenting minimal load to external drive circuits. The MGT may combine the high temperature, high current density switching characteristics of the BJT with the minimal drive requirement of the MOSFET.

Most power semiconductor devices are formed of silicon ("Si"), although a variety of other semiconductor materials have also been used. Silicon carbide ("SiC") is one of these alternate materials. SiC has potentially advantageous semiconductor characteristics including, for example, a wide band-gap, high electric field breakdown strength, high thermal conductivity, high inching point and high-saturated electron drift velocity. Thus, relative to devices formed in other semiconductor materials such as, for example, Si, electronic devices formed in SiC may have the capability of operating at higher temperatures, at high power densities, at higher speeds, at higher power levels and/or under high radiation densities.

SUMMARY

Pursuant to embodiments of the present invention, high power wide band-gap MOSFET-gated bipolar junction transistors ("MGT") are provided. These MGTs include a first wide band-gap bipolar junction transistor ("BJT") having a first collector, a first emitter and a first base, a wide band-gap MOSFET having a source region that is configured to provide a current to the base of the first wide band-gap BJT and a second wide band-gap BJT having a second collector, a second emitter and a second base. The second collector is electrically connected to the first collector, the second emitter is electrically connected to the first emitter, and the second base is electrically connected to the first base.

In some embodiments, the second base may be thinner than the first base. The second BJT may provides a non-destructive avalanche current path within an active area of the MGT. The first and second wide band-gap BJTs may be formed on a substrate, and a drift region may be formed on the substrate. In such embodiments, a distance between the first base and the drift region may exceed the distance between the second base and the drift region. In some embodiments, a breakdown voltage of the high power wide band-gap MGT may exceed at least 5,000 volts.

In some embodiments, the first and second wide band-gap BJTs and the wideband MOSFET may be formed of silicon carbide. Moreover, the device may be configured so that the minority carrier injection from the first emitter into the first base exceeds the minority carrier injection from the first collector into the first base when the MGT is turned on.

Pursuant to further embodiments of the present invention, high power wide band-gap MGTs are provided. These MGTs include a silicon carbide ("SiC") bipolar junction transistor having a collector, an emitter and a base and a SiC MOSFET having a source region that is configured to provide a current to the base of the SiC BJT. A breakdown voltage of the SiC BJT exceeds at least 5,000 volts.

In some embodiments, the MGT supports collector current densities of at least 30 A/cm². The SiC substrate may comprise an n-type SiC substrate, the SiC BJT may comprise an n-p-n BJT that has an n-type drift layer, the base layer may be a p-type base layer, the SiC MOSFET may comprise an n-MOSFET that includes an n-type drain region, and the source region may comprise an n-type source region that is spaced apart from the n-type drain region. In other embodiments, the MGT may also include a SiC substrate of a first conductivity type that acts as the collector of the SiC BJT, a drift layer of the first conductivity type on the SiC substrate opposite a collector contact, a base layer of a second conductivity type that is opposite the first conductivity type, the base layer provided on the drift layer opposite the SiC substrate, an emitter layer of the first conductivity type on the base layer opposite the drift layer. In such embodiments, the base is part of the base layer, and the collector is electrically connected to the n-type drain region.

Pursuant to still further embodiments of the present invention, high power wide band-gap MGTs are provided that include an n-type bulk single crystal silicon carbide ("SiC") substrate. An n-type SiC drift layer is on the n-type conductivity bulk single crystal SiC substrate, the n-type drift layer having a first carrier concentration that is less than a second carrier concentration of the n-type SiC substrate. A patterned p-type SiC layer is provided in the n-type SiC drift layer, the patterned p-type SiC layer including a base region and a source isolation region that includes a channel region. A patterned n-type SiC layer is provided in the p-type SiC layer, the patterned n-type SiC layer including a source region that is located in the source isolation region of the patterned p-type SiC layer and an emitter region in the base region of the patterned p-type SiC layer. An insulating layer is provided on the source region, the channel region, and the n-type drift layer. A gate electrode is provided on the insulating layer. A collector contact is provided on a surface of the SiC substrate opposite the n-type drift layer. An emitter contact is provided on the emitter region of the patterned n-type SiC layer. The source region is electrically connected to the base region. A breakdown voltage of the device exceeds at least 5,000 volts.

DETAILED DESCRIPTION

Figure 1:
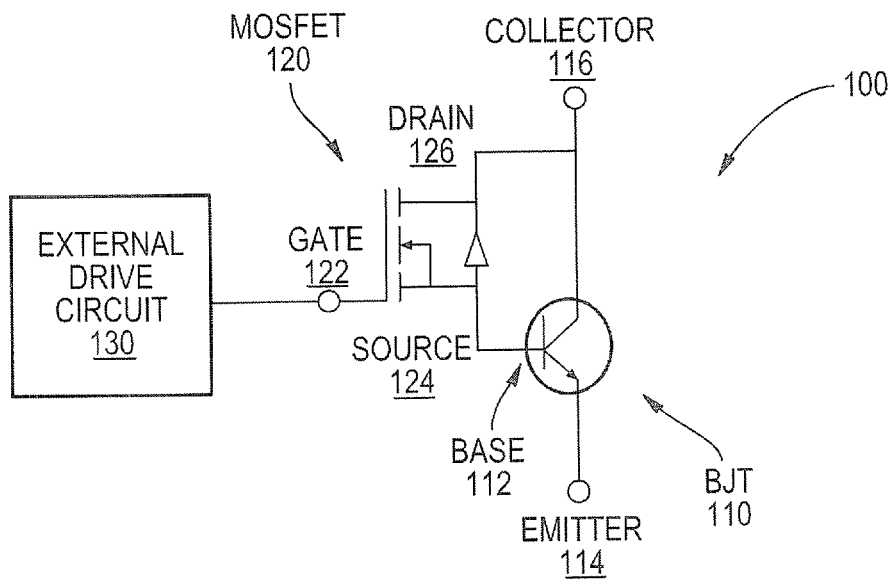
FIG. 1 is a circuit diagram of a high power MGT according to certain embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Furthermore, relative terms, such as "lower" or "bottom" and "upper" or "top," may be used herein to describe one element's relationship to another elements as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle may have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

High power SiC MOSFETs are in wide use today for applications requiring high voltage blocking such as voltage blocking of 5,000 volts or more. By way of example, SiC MOSFETs are commercially available that are rated for current densities of 10 A/cm$^2$ that will block voltages of at least 10 kV. As is known to those of skill in the art, a "blocking voltage" refers to the voltage that may be applied across the channel of a transistor when the transistor is in its "off" state without significant leakage current flowing through the channel. The "breakdown voltage" of a transistor refers to the voltage applied across the channel of the transistor in its "off" state at which significant leakage current starts to flow. For high power applications (i.e., for transistors that are designed to block 1,000 volts or more), the breakdown voltage of the transistor may be considered to refer to the voltage applied across the channel of the transistor when the transistor is in its "off" state that results in leakage currents greater than one micro-amp.

To form a power SiC MOSFET, typically a plurality of "unit cells" are formed, where each unit cell comprises a single MOSFET that includes a gate electrode, a source region and a drain region. In practice, a single gate electrode is typically formed on a first side of a semiconductor substrate that acts as the gate electrode for each of the unit cells. The opposite side of the semiconductor substrate acts as a common drain (or source) for the device. A plurality of source (or drain) regions are interposed within openings in the gate electrode. These source regions are also electrically connected to each other.

As should be clear from the above description, the gate electrode of a typical power SiC MOSFET may extend across the entire active area of the device, with openings provided in the gate electrode to provide access to the source (or drain) regions of the unit cells. Moreover, in order to increase the minimum breakdown voltage supported by the device, the number of unit cells is typically increased. As the total gate area of the device is a function of the number of unit cells, the size of the active area generally increases as the minimum required breakdown voltage is increased. As the active area of the SiC MOSFET increases, so does the total area of the gate insulation layer that separates the gates of each unit cell of the MOSFET from the underlying channels.

Unfortunately, it can be difficult to manufacture both SiC substrates and gate insulation layers on SiC substrates that are free from defects. Defects that are present in the SiC substrate and/or in the gate insulation layer can cause a high power SiC MOSFET to fail various specified performance parameters such as, for example, minimum breakdown voltage, current rating, etc. As the size of the active area and the gate insulation layer are increased, the probability that a fatal defect is present may also increase. As such, it can be difficult to manufacture SiC MOSFETs that are used in very high power applications, and the manufacturing yield (i.e., the percentage of devices manufactured that meet specifications) for such devices (e.g., for a 10 kV/10A high power SiC MOSFET) may be relatively low.

It also can be difficult to consistently manufacture very high power SiC MOSFETs that have a turn-on voltage which falls within a desired range (e.g., between 2-3 volts). The channel mobility of very high power SiC MOSFETs may also be undesirably low. Moreover, the reverse leakage current in very high power SiC MOSFETs may be relatively high as compared to similarly sized BJTs, particularly at elevated temperatures. This higher reverse leakage current may preclude the use of SiC MOSFETs in some applications or require the use of a higher power SiC MOSFET to obtain acceptable reverse leakage current performance. However, the use of an even higher power SiC MOSFET may exacerbate the above-mentioned problems with respect to manufacturing yield, threshold voltage control and channel mobility.

Pursuant to embodiments of the present invention, high power SiC MGT switches are provided that may exhibit performance characteristics that are equal or better than the performance of available power SiC MOSFET switches. The high power SiC MGTs according to embodiments of the present invention may also be easier to manufacture than comparable power SiC MOSFET devices. The high power SiC MGTs disclosed herein are voltage controlled devices, and hence can typically be controlled by a relatively simple drive circuit, in contrast to typical high power BJT switches. Moreover, selected of the unit cells in these devices may include a second "avalanche" BJT that is in parallel to the main BJT of the unit cell. The provision of unit cells that include these avalanche BJTs may provide a leakage current path within the active area of the device. As a result, the MGTs according to embodiments of the present invention may experience avalanche breakdown without destroying the device.

FIG. 1 is a circuit diagram of a high power SiC MGT 100 according to certain embodiments of the present invention. As shown in FIG. 1, the MGT 100 includes a SiC power BJT 110 that has a base 112, an emitter 114 and a collector 116. The MGT 100 further includes a SiC power MOSFET 120 having a gate 122, a source 124 and a drain 126. The power BJT 110 and the power MOSFET 120 are connected in a Darlington configuration. Thus, as shown in FIG. 1, the source 124 of the SiC power MOSFET 120 is electrically connected to the base 112 of the SiC power BJT 110, and the drain 126 of the SiC power MOSFET 120 is electrically connected to the collector 116 of the SiC power BJT 110. Thus, when the SiC power MOSFET 120 is turned on, the current flowing through the channel of the MOSFET 120 provides a current path between the collector 116 and the base 112 of the SiC power BJT 110. This current acts as the base current that drives the BJT 110. An external drive circuit 130 may be connected to the gate 122 of the SiC power MOSFET 120 for applying a gate bias voltage to the power MOSFET 120. The SiC power MOSFET 120 thus converts the SiC power BJT 110 from a current driven device to a voltage driven device, which may allow for a simplified external drive circuit 130. The SiC power MOSFET 120 thus is a driver transistor, and the SiC power BJT 110 is the output transistor of the MGT 100.

The external drive circuit 130 outputs a bias voltage that is applied to the gate 122 of the SiC power MOSFET 120 to turn the MGT 100 on or off. The bias voltage will typically be constrained to be within a predetermined range such as, for example, about −5 V to about 15 V. The SiC power MOSFET 120 may be designed to turn on when the external drive circuit 130 applies a voltage within a predetermined range to the gate 122 thereof. This turn on or "threshold" voltage may be designed, for example, to be in the range of 2-3 volts.

The driver MOSFET transistor 120 of the SiC MGT 100 of FIG. 1 may have a relatively small footprint, while the output BJT transistor 110 has relatively large footprint. Herein, the "footprint" of a device refers to the area of the device when the device is viewed from above at an angle normal to the semiconductor substrate. The MGT 100 can be implemented via monolithic integration or hybrid combination of the transistors 110 and 120, as will be discussed in further detail herein. The MGT 100 can be turned on with a gate voltage as compared to a stand-alone SiC BJT power switch with the same power rating, and hence the external drive circuit 130 may be relatively simple as compared to the external drive circuit of a SiC BJT. Moreover, the MGT 100 of FIG. 1 can provide improved yield and performance as compared to a stand-alone SiC power MOSFET switch.

Power SiC MGTs have been developed previously. For example, FIG. 2 is a graph showing the output current in Amps as a function of forward voltage drop (i.e., the voltage drop $V_{CE}$ between the collector and emitter of the BJT in the device) for a variety of gate voltages for a 1.2 kV/4A power SiC MGT.

Figure 2:
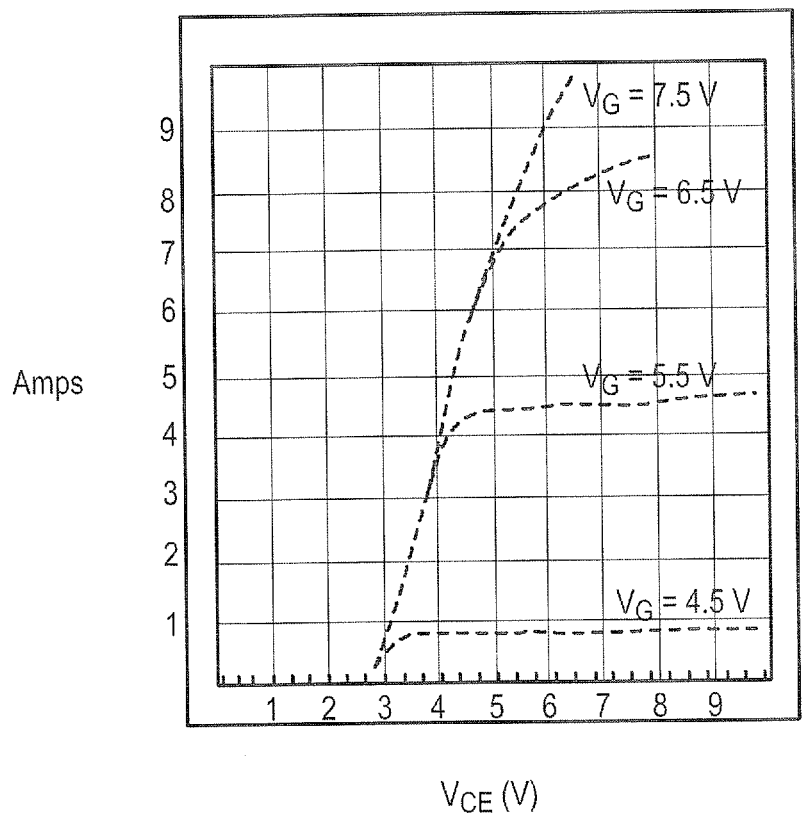
FIG. 2 is a graph illustrating collector current as a function of forward voltage drop for a 1.2 kV/4A SiC MGT for a variety of different gate voltages.

As shown in FIG. 2, the power SiC MGT exhibits a forward drop offset of approximately 2.7 volts (i.e., the minimum forward voltage drop required to turn the transistor on is approximately 2.7 volts, regardless of the applied gate voltage). Because of this 2.7 volt minimum forward voltage drop, at a certain package power dissipation limit, a comparable power SiC MOSFET (e.g., a 1.2 kV/4A power SiC MOSFET) will support significantly higher output current densities than will the 1.2 kV/4A power SiC MGT having the performance indicated in FIG. 2. Since a 1.2 kV/4A or comparable power SiC MOSFET outperforms the SiC MGT of FIG. 2, high power SiC MGTs have generally not been employed in commercial applications.

As the minimum required breakdown voltage is increased (e.g., to provide breakdown voltages greater than 5 kV), it may become necessary to operate power SiC MOSFETs at high forward voltage drops in order to support the required output current densities. Moreover, as will be shown herein, the power SiC MGTs according to embodiments of the present invention may exhibit larger increases in output current density for a corresponding increase in forward voltage drop, at least at high gate voltages as compared to similarly sized and rated power SiC MOSFET switches. This can be seen in FIG. 3, which is a graph illustrating the output current density $J_{CE}$ (A/cm$^2$) as a function of forward voltage drop for both a prior art 10 kV/10A power SiC MOSFET and a 10 kV/10A power SiC MGT according to embodiments of the present invention for a variety of gate voltages, for room temperature operation.

Figure 3:
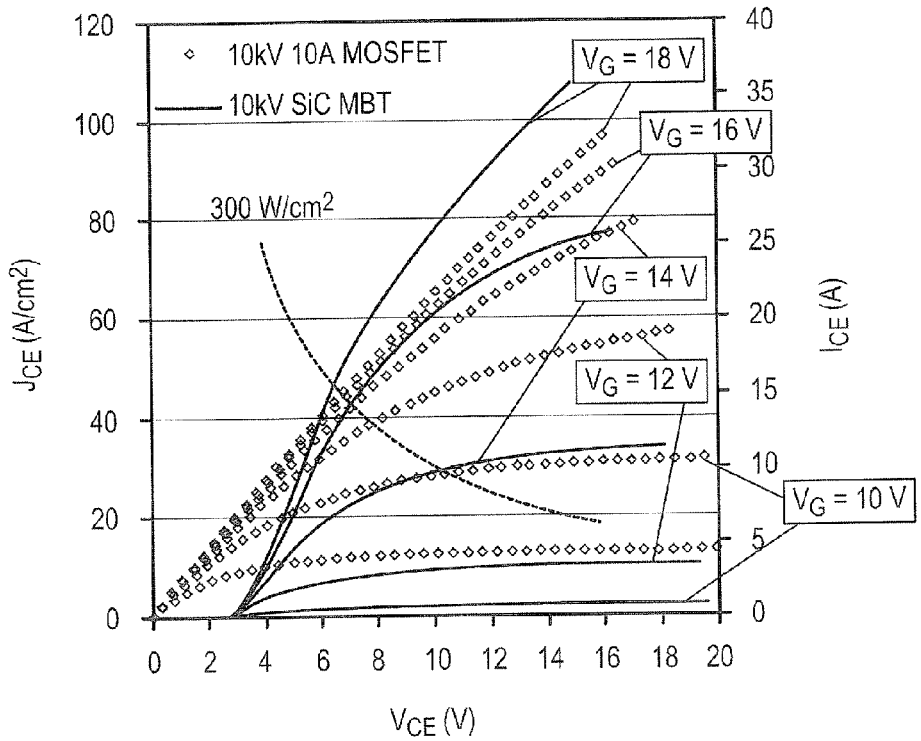
FIG. 3 is a graph illustrating collector current as a function of forward voltage drop for both a 10 kV/10A SiC MOSFET and a 10 kV/10A SiC MGT for a variety of different gate voltages.

In particular, as shown in FIG. 3, at the 300 W/cm$^2$ package power dissipation limit, at a gate voltage of 16 volts, the 10 kV/10A power SiC MGT operates at a forward voltage drop of approximately 6.3 volts. This forward voltage drop is slightly lower than the forward voltage drop at a gate voltage of 16 volts for a comparable 10 kV/10A power SiC MOSFET. As such, the 10 kV/10A power SiC MGT according to embodiments of the present invention can provide at least the same collector current densities as can the 10 kV/10A power SiC MOSFET.

In certain embodiments of the present invention, the power SiC MGT may comprise a power SiC BJT that is driven by a power SiC MOSFET with a smaller current rating than that of the BJT. As shown in FIG. 3, once $V_{CE}$ exceeds the 2.7 forward voltage drop offset, the collector current starts to increase sharply with small increases in $V_{CE}$ (as compared to the power SiC MOSFET) due to the amplification of the saturation current of the SiC BJT by the transconductance of the driver SiC MOSFET.

As noted above, high power SiC MOSFETs may be formed of a plurality of unit cells that provide a plurality of electrically parallel MOSFETs. Similarly, the high power SiC MGTs according to embodiments of the present invention may likewise be implemented as a plurality of electrically parallel unit cells, where each unit cell includes a driver SiC MOSFET that is coupled to an output SiC BJT. However, it will also be appreciated that the unit cells according to embodiments of the present invention may also be utilized to make a single unit cell device.

Figure 4:
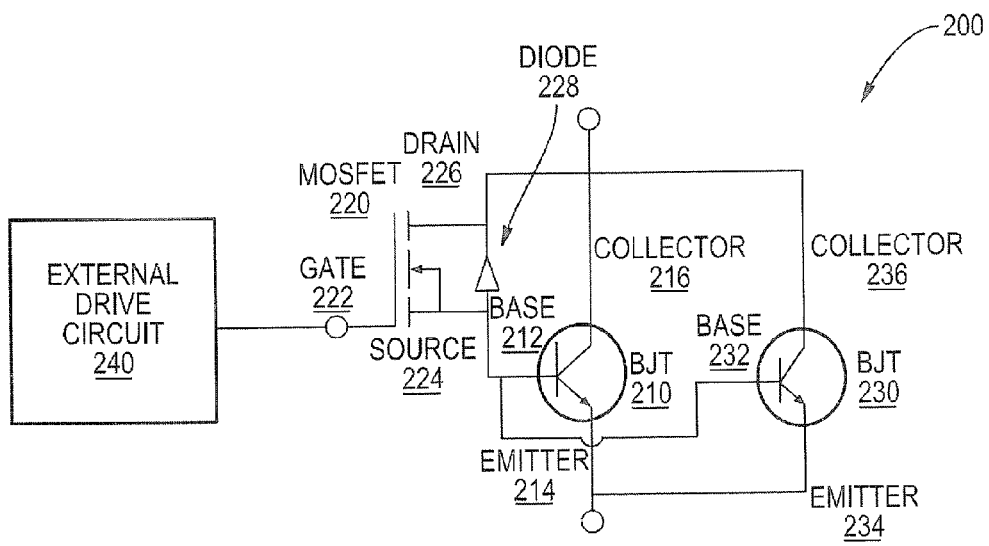
FIG. 4 is a circuit diagram of a high power MGT according to embodiments of the present invention.

FIG. 4 is a circuit diagram of a SiC MGT 200 according to further embodiments of the present invention that includes an avalanche current path in the active region of the device. As known to those of skill in the out, "avalanche breakdown" (which is sometimes simply referred to as "avalanche") in a BJT refers to a rapid current multiplication that can occur when a strong electric field is applied to the device. In power SiC BJTs, much of this avalanche current will typically flow through termination region of the device that surrounds the active area of the device. Unfortunately, when this occurs, the avalanche current may permanently destroy the device. As will be discussed below, the high power MGTs according to embodiments of the present invention may include leakage current paths within the active area of the device that carry the avalanche current when the device breaks down. When the avalanche current is carried through these leakage current paths it will not destroy the device, and hence the SiC MGTs according to certain embodiments of the present invention may survive avalanche events.

As shown in FIG. 4, the MGT 200 includes a standard power SiC BJT 210 that has a base 212, an emitter 214 and a collector 216. The MGT 200 further includes a SiC power MOSFET 220 having a gate 222, a source 224 and a drain 226. The standard power BJT 210 and the power MOSFET 220 are connected in a Darlington configuration such that the source 224 of the SiC power MOSFET 220 is electrically connected to the base 212 of the SiC power BJT 210, and the drain 226 of the SiC power MOSFET 220 is electrically connected to the collector 216 of the SiC power BJT 210. Thus, when the SiC power MOSFET 220 is turned on, the current flowing through the channel of the MOSFET 220 provides a current path between the collector 216 and the base 212 of the SiC power BJT 210. This current acts as the base current that drives the BJT 210. An external drive circuit 240 is connected to the gate 222 of the SiC power MOSFET 220 for applying a gate bias voltage to the power MOSFET 220 to convert the SiC power BJT 210 from a current driven device to a voltage driven device.

As is further shown in FIG. 4, a second "avalanche" SiC BJT 230 having a base 232, an emitter 234 and a collector 236 is electrically connected in parallel to the first power BJT 210. This avalanche BJT 230 provides a current path for avalanche currents in the event of device breakdown. In particular, as will be discussed in greater detail herein, the emitter 234 on the avalanche BJT 230 is formed deeper into the device than the emitter 214 on the standard BJT 210. As a result, the base layer 232 on the avalanche BJT 230 is thinner than the base layer 212 on the standard BJT 210. Thus, in the avalanche BJT 230, the emitter-base p-n junction is closer to the collector-base p-n junction than are the corresponding p-n junctions in the standard BJT 210. Thus, when an avalanche condition occurs, a leakage current path is provided through the avalanche BJT 230. This is a non-destructive leakage current path, and hence the MGTs 200 can handle an avalanche event without being destroyed.

Figure 5:
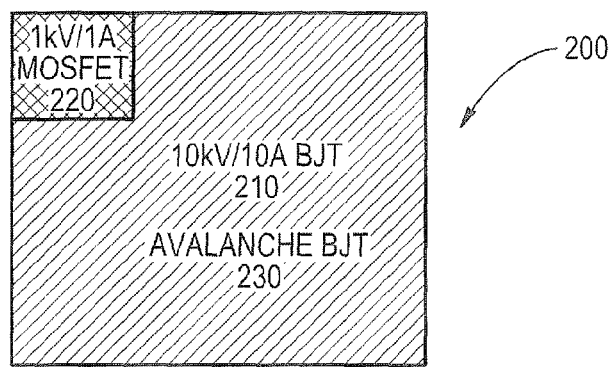
FIG. 5 is a plan view of a 10 kV/10A SiC MGT according to embodiments of the present invention.
Figure 6:
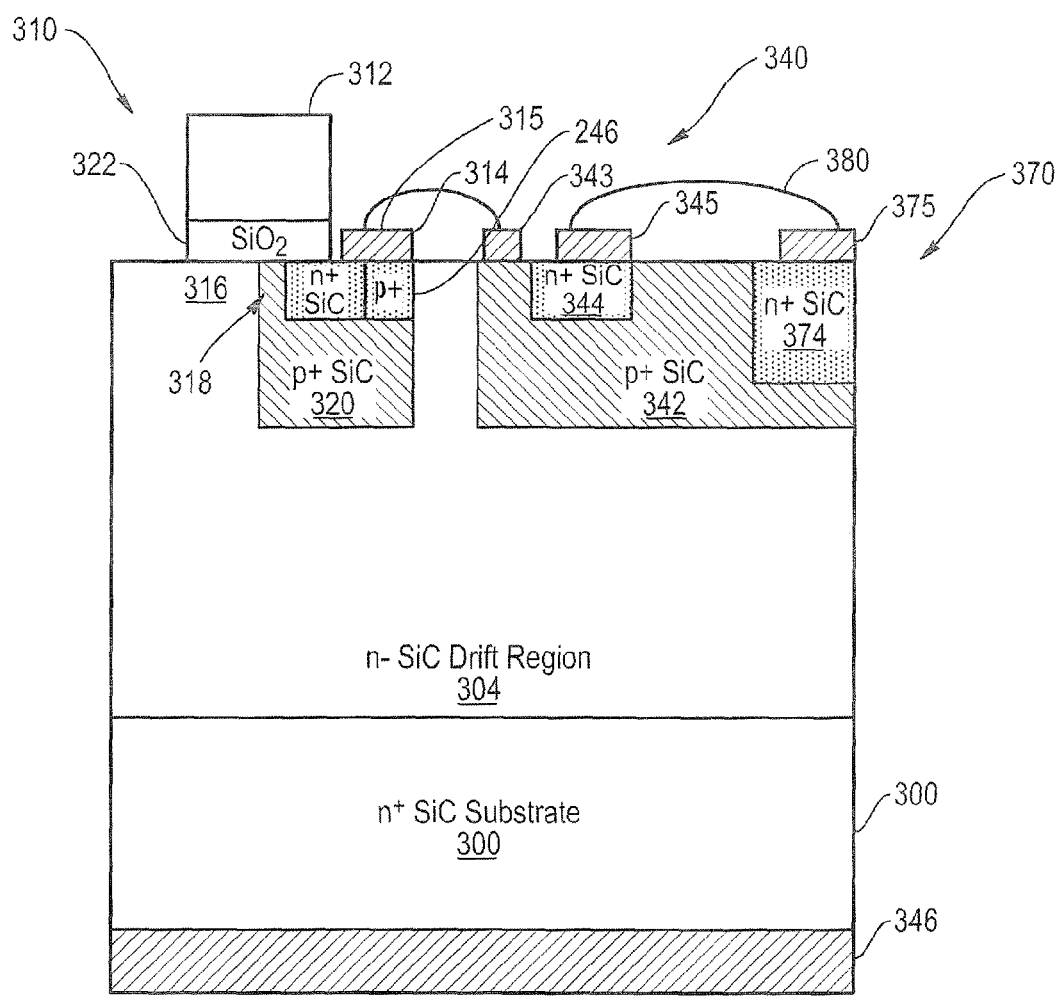
FIG. 6 is a schematic cross-sectional view of a "unit cell" of the 10 kV/10A SiC MGT of FIG. 5.

The MGT 200 of FIG. 4 will now be described in greater detail with respect to FIGS. 5 and 6. FIG. 5 is a plan view of the MGT 200. FIG. 6 is a schematic cross-sectional diagram of (a) one of a plurality of individual MOSFETs 310 that is used to form the MOSFET 220 of FIG. 4, (b) one of a plurality of individual standard BJTs 340 that is used to form the standard BJT 210 of FIG. 4, and (c) one of a plurality of individual avalanche BJTs 370 that is used to form the avalanche BJT 230 of FIG. 4. It will be appreciated that to form the power MGT 200, the plurality of individual MOSFETs 310 would be implemented in parallel, the plurality of the individual standard BJTs 340 would be implemented in parallel, and the plurality of the individual avalanche BJTs 370 would be implemented in parallel. As is made clear from FIG. 5, in some embodiments, the individual MOSFETs 310 may be spatially separated from the individual BJTs 340, 370. In other embodiments, the individual MOSFETs 310 and the individual BJTs 340, 370 may be intermixed throughout the device. In either case, the combination of an individual MOSFET 300, an individual standard BJT 340 and an individual avalanche BJT 370 may functionally be viewed as a unit cell of the MGT 200. Thus, for ease of description, FIG. 5 illustrates the individual MOSFETs 310 and the individual BJTs 340, 370 implemented next to each other in a unit cell configuration.

Turning now to FIG. 5, it can be seen that the SiC MGT 200 may comprise, for example, a 10 kV/10A standard SiC BJT 210 that is driven by a 10 kV/1A power SiC MOSFET 220. The device further includes a 10 kV/1A avalanche BJT 230 that is implemented in parallel to the standard BJT 210.

As shown in FIG. 5, the 10 kV/10A standard SiC BJT 210 takes up the vast majority of the area of the MGT 200. The plan view area required for the 10 kV/10A power SiC MGT 200 may be approximately the same amount of area that would be required to form a 10 kV/10A power SiC MOSFET. Thus, it can be seen from FIG. 5 that the MOSFET of a 10 kV/10A power SiC MGT 200 is significantly smaller than a 10 kV/10A power SiC MOSFET. Since defects in the MOSFET gate area and/or in the SiC substrate used to form the SiC MOSFET tend to dominate whether or not these devices meet specification, the 10 kV/10A power SiC MGT 200 may have significantly improved manufacturing yields as compared to 10 kV/10A power SiC MOSFET devices.

Turning now to FIG. 6, it can be seen that, according to some embodiments of the present invention, the 10 kV/10A power SiC MGT 200 may be implemented as a monolithic structure. In particular, as shown in FIG. 6, each of the MOSFET 310, the standard BJT 340 and the avalanche BJT 370 are formed on the same bulk single crystal SiC substrate 300 of n-type conductivity SiC.

The middle portion of FIG. 6 illustrates a cross-sectional view of the standard BJT 340. As shown in FIG. 6, a layer of n-type conductivity SiC may be formed on the upper surface of the SiC substrate 300 to form an n⁻ drift region 304. The carrier concentration of the substrate 300 is higher than the carrier concentration of the n⁻ drift region 304. Thus, the SiC substrate 300 may be referred to as an n⁺ SiC substrate. In other embodiments (not shown in the figures), an n⁻ SiC substrate that has an n⁺ region implanted in the lower surface thereof could be used instead of the substrate 300 so as to provide an p⁻ layer on an n⁺ substrate.

A p-type layer is provided in an upper region of the n⁻ drift region 304. The p-type layer may be epitaxially grown, and may comprise a p-type conductivity SiC layer. As shown in FIG. 6, the middle portion of the p-type layer comprises the base 342 of the BJT 340. An n⁺ SiC layer is formed in an upper region of the middle portion of the p-type base 342. This n⁺ layer comprises the emitter 344 of the BJT 340. The n⁺ SiC substrate 300 acts as the collector of the BJT 340. An ohmic contact is formed on the lower surface of the substrate 300 to create a collector contact 346. An ohmic contact is formed on the n⁺ SiC emitter 344 to provide an emitter contact 345 for the BJT 340. An ohmic contact is formed on the p+ SiC base 342 to provide a base contact 343 for the BJT 340.

The right-hand side of FIG. 6 illustrates a cross-sectional view of the avalanche BJT 370. As shown in FIG. 6, the base layer 342 of the standard BJT 340 also acts as the base of the avalanche BJT 370. An n+ SiC layer is formed in an upper region of the right-hand portion of the p-type base layer 342. This n+ layer comprises the emitter 374 of the BJT 370. The n+ SiC substrate 300 acts as the collector of the BJT 370. The emitter 374 of the avalanche BJT 370 extends deeper into the device than does the emitter 344 of the standard BJT 340. Consequently, the base region of the avalanche BJT 370 is thinner than is the base region of the standard BJT 340. As discussed below, this facilitates providing an avalanche capability to the MGT 200. An ohmic contact is formed on the n+ SiC emitter 374 to provide an emitter contact 375 for the BJT 370. The emitter contacts 345, 375 are electrically connected to each other as schematically illustrated by the conductive line 380 in FIG. 6.

The left-hand side of FIG. 6 illustrates a cross-section of the power SiC MOSFET 310. The MOSFET 310 is formed on then drift region 304. As shown in FIG. 6, a p+ SiC region 320 is provided in an upper region of the n− drift region 304. An n+ SiC region 314 is formed in an upper region of the p-type region 320. Region 314 comprises the source of the MOSFET 310. The portion of the n− drift region 304 to the left of the p+ SiC region 320 (which is labeled 316 in FIG. 6) comprises the drain of the MOSFET 310. The portion of the p+ region 320 that is disposed between the source region 314 and the drain region 316 comprises the channel 318 of the MOSFET 310. The p+ region 320 and the base 342 of the BJTs 340, 370 may, in some embodiments, all be formed from a single, epitaxially grown p+ SiC layer. Likewise, the source region 314 of the MOSFET 310 and the emitters 344, 374 of the BJTs 340, 370 may, in some embodiments, all be formed from a single, epitaxially grown n+ SiC layer. An ohmic contact 315 may be provided on the source region 314. The drain region 316 may be electrically connected to the collector contact 346 through the substrate 300.

An insulation layer 322 such as, for example, a silicon dioxide layer is selectively formed above the channel 318 of the MOSFET 310. A gate electrode 312 such as, for example, a SiC layer is formed on the insulation layer 322 to complete the MOSFET 310. As is schematically shown in FIG. 6, the source region 314 of the MOSFET 310 is electrically connected to the base 342 of the BJT 340 via an electrical connection between the ohmic contact 315 and the ohmic contact 343. This may be accomplished, for example, using contact plugs and a conductive line (not shown in FIG. 6).

With regard to the carrier concentrations, the p+ and n+ conductivity type regions and epitaxial layers described above may be as heavily doped as possible without causing excessive fabrication defects. Suitable dopants for producing the p-type SiC regions include aluminum, boron or gallium. Suitable dopants for producing the n-type SiC regions include nitrogen and phosphorus.

Figure 7:
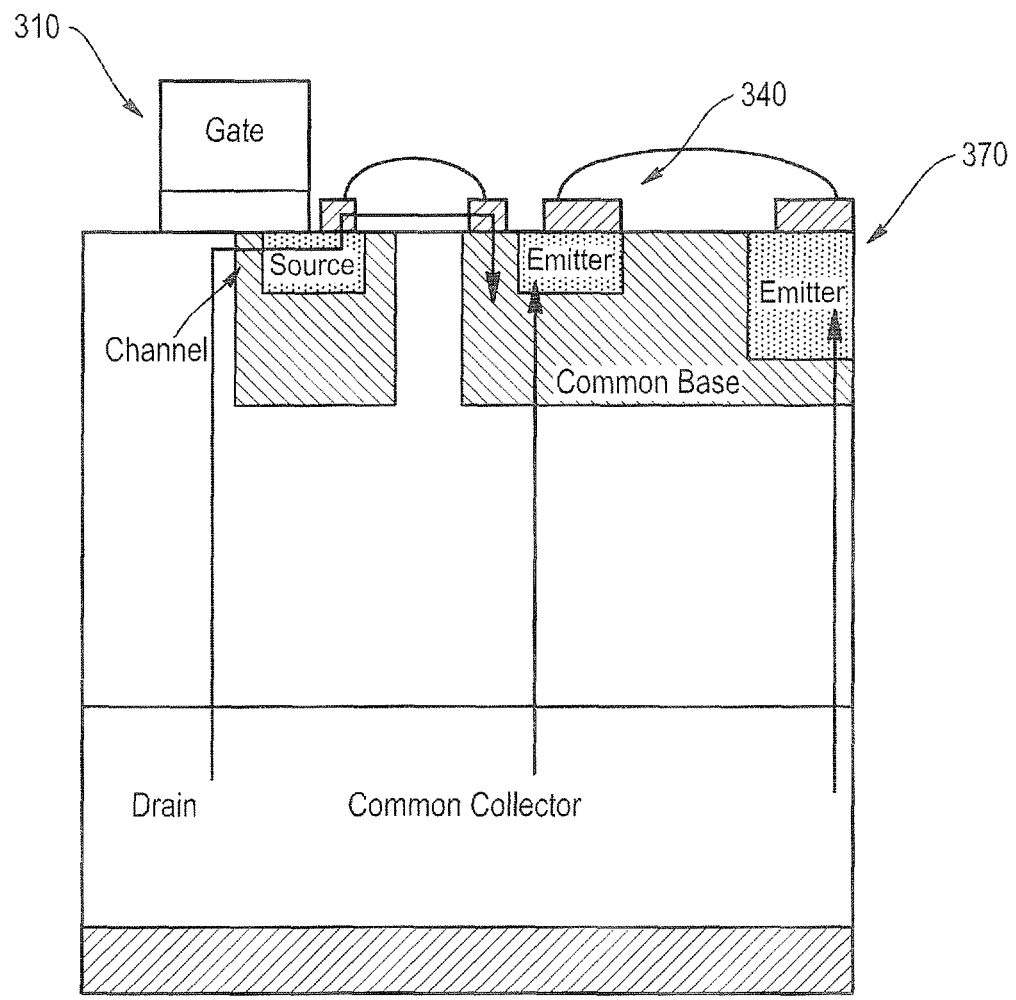
FIG. 7 is a schematic diagram illustrating the current flows through the "unit cell" of FIG. 6.

The power SiC MGT 200 described above with reference to FIGS. 4-6 can be turned on by applying a positive bias of about 3-10 volts on the collector contacts 346 of the BJTs 340, 370 and applying a positive bias of about 3-16 volts on the gate electrodes 312 of the MOSFETs 310 while the emitters 344, 374 of the BJTs 340, 370 are kept at ground potential. As shown in FIG. 7, by positively biasing the gate electrode 312 with respect to the source 314 of each of the MOSFETs 310 allows a path for the flow of electrons from the collector 300 to the base 342 of the BJTs 340, 370, thereby forward biasing the p-n junction between the emitter 344 and the base 342 of BJT 340 and between the emitter 374 and the base 342 of BJT 370.

The MGT 200 achieves a high current density by the injection of minority carriers into the low doped drift region by the turn-on of each BJT 340, 370. The base current supplied to each BJT 340, 370 is limited by the saturation current of its corresponding MOSFET 310. By applying a higher gate voltage to the MOSFETs 310, a higher saturation current will flow through each MOSFET 310. This higher saturation current provides a higher base current into each corresponding BJT 340, 370 and hence a higher saturation current for the MGT 200.

The MGT 200 enters the forward blocking mode of operation when the potential of the gate electrodes 312 are set to ground. This turns off the MOSFETs 310, thereby reducing the base current into the BJTs 340, 370 to approximately zero. After the minority carriers of the BJTs 340, 370 decay with their characteristic lifetime, the MGT 200 stops carrying current and can support (and hence block) significant voltage levels that are applied to the collectors 300.

When a large voltage is applied across the collector-base p-n junction of a BJT, the n-type drift region of the device becomes depleted. The bias applied across the emitter-base p-n junction of the BJT likewise depletes the area adjacent the emitter-base p-n junction. The region between these two depletion regions blocks the voltage applied to the collector. The size of each depletion region is a function of, among other things, the applied voltages. If the two depletion regions are large enough, then they can overlap to create a single large depletion region. When this occurs, current can leak from the collector to the emitter, which is referred to as "reach through" current.

As shown in FIG. 6, in the MGT 200, the BJT 370 has a thinner base region 342, and thus in the avalanche BJT 370 the emitter-base p-n junction in BJT 370 is closer to the collector-base p-n junction than are the corresponding emitter-base and collector-base p-n junctions in the standard BJT 340. Thus, if an avalanche condition occurs, a non-destructive leakage current path is provided through BJT 370 that allows the device to survive an avalanche event. The tunnel diode 228 (see FIG. 4) that is provided between the source and drain of the MOSFET likewise provides an avalanche current path for the MOSFET 220 of MGT 200.

It will be appreciated that, in some embodiments, an avalanche BJT 370 will only be included on some of the "unit cells" of the device. For example, in some embodiments, less than 25% of the unit cells will include the avalanche BJT 370, and instead will only include the MOSFET 310 and the standard BJT 340. For example, in some embodiments, between about 5% and about 15% of the unit cells will include an avalanche BJT 370.

Figure 8:
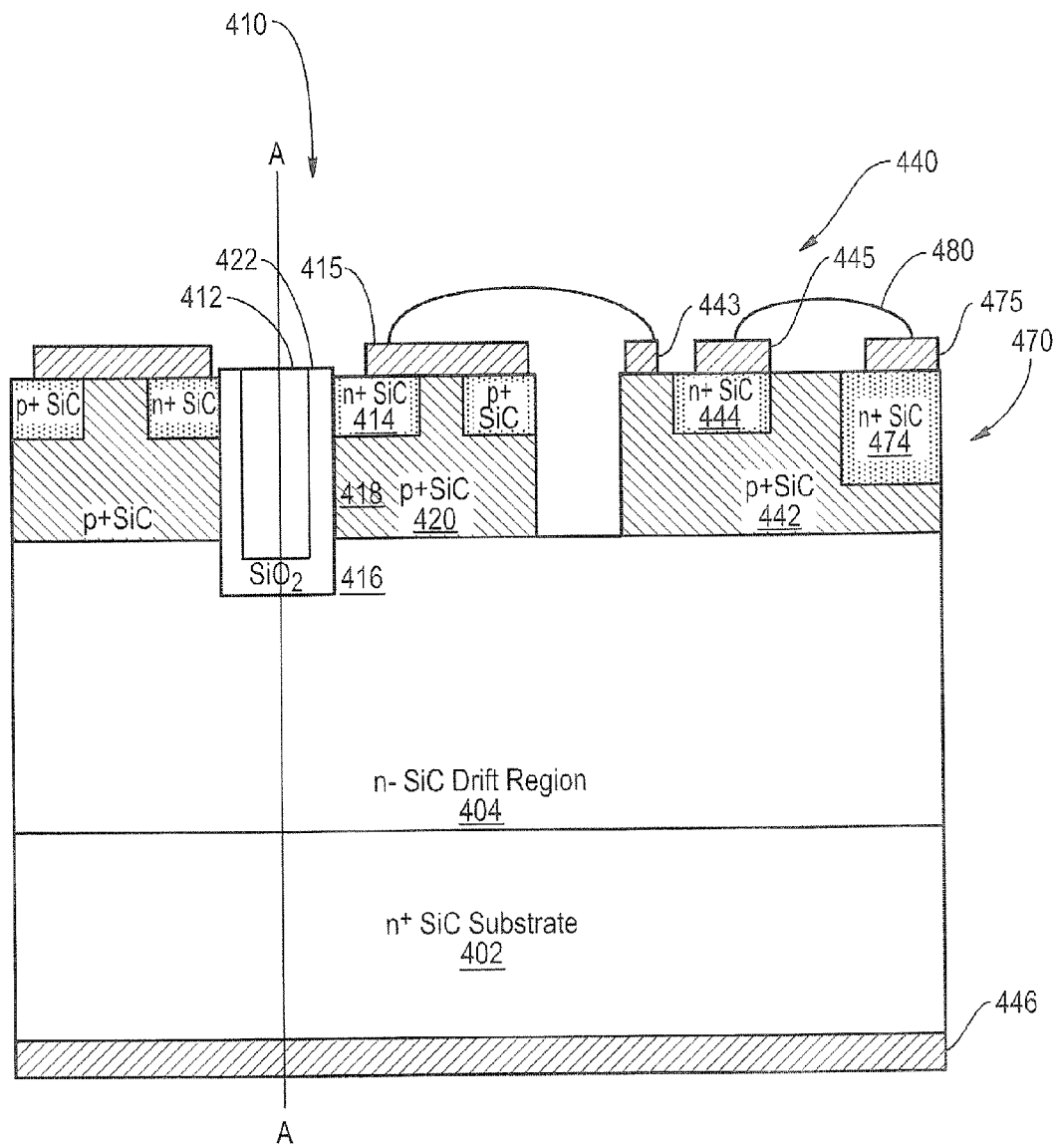
FIG. 8 is a schematic cross-sectional plan view of a "unit cell" of a 10 kV/10A SiC MGT according to further embodiments of the present invention that has a trench structure.

The power SiC MGT 200 illustrated in FIG. 6 has a planar structure. FIG. 8 is a schematic cross-sectional diagram of a unit cell of a 10 kV/10A power SiC MGT 400 according to further embodiments of the present invention that has a trench structure. The unit cell includes an individual MOSFET 410, an individual standard BJT 440 and an individual avalanche BJT 470. As shown in FIG. 8, each of the MOSFET 410, the standard BJT 440 and the avalanche BJT 470 are formed on the same bulk single crystal SiC substrate 402 of n-type conductivity SiC. In FIG. 8, the unit cell extends from the line A-A to the right. The area to the left of line A-A in FIG. 8 comprises part of an adjacent unit cell.

The middle portion of FIG. 8 illustrates a cross-sectional view of the standard BJT 440. As shown in FIG. 8, a layer of n-type conductivity SiC may be formed on the upper surface of the SiC substrate 402 to form an n⁻ drift region 404. The carrier concentration of the substrate 402 is higher than the carrier concentration of the n⁻ drift region 404. A p-type layer is provided in an upper region of the n⁻ drift region 404. The p-type layer may be epitaxially grown, and may comprise a p-type conductivity SiC layer. As shown in FIG. 8, the middle portion of the p-type layer comprises the base 442 of the BJT 440. An SiC layer is formed in an upper region of the middle portion of the p-type base 442. This n⁺ layer comprises the emitter 444 of the BJT 440. The n⁺ SiC substrate 402 acts as the collector of the BJT 440. An ohmic contact is formed on the lower surface of the substrate 402 to create a collector contact 446. An ohmic contact is formed on the n⁺ SiC emitter 444 to provide an emitter contact 445 for the BJT 440. An ohmic contact is formed on the p⁺ SiC base 442 to provide a base contact 443 for the BJT 440.

The right-hand side of FIG. 8 illustrates a cross-sectional view of the avalanche BJT 470. As shown in FIG. 8, the base layer 442 of the standard BJT 440 also acts as the base of the avalanche BJT 470. An SiC layer is formed in an upper region of the right-hand portion of the p-type base layer 442. This n⁺ layer comprises the emitter 474 of the BJT 470. The n⁺ SiC substrate 402 acts as the collector of the avalanche BJT 470. The emitter 474 of the avalanche BJT 470 extends deeper into the device than does the emitter 444 of the standard BJT 440. Consequently, the base region of the avalanche BJT 470 is thinner than is the base region of the standard BJT 440 to facilitate providing an avalanche capability to the MGT 400. An ohmic contact is formed on the n⁺ SiC emitter 474 to provide an emitter contact 475 for the BJT 470. The emitter contacts 445, 475 are electrically connected to each other as schematically illustrated by the conductive line 480 in FIG. 8.

The left-hand side of FIG. 8 illustrates a cross-section of the power SiC MOSFET 410. As shown in FIG. 8, the MOSFET 410 has a trench structure. As shown in FIG. 8, a p⁺ SiC region 420 is provided in an upper region of the n⁻ drift region 404. An n⁺ SiC region 414 is formed in an upper region of the p-type region 420. Region 414 comprises the source of the MOSFET 410. The portion of the n⁻ drift region 404 under the p⁺ SiC region 420 comprises the drain 416 of the MOSFET 410. The portion of the p⁺ region 420 that is disposed between the source region 414 and the drain region 416 comprises the channel 418 of the MOSFET 410. An ohmic contact 415 may be provided on the source region 414. The drain region 416 may be electrically connected to the collector contact 446 through the substrate 402.

An gate trench is selectively formed to the left of the p⁺ SiC layer 420 to expose and extend into the n⁻ SiC layer 404. An insulator layer 422, which may be, for example, an oxide layer such as silicon dioxide, is formed on the sidewalls and bottom of the gate trench. A gate electrode 412 may be provided in the gate trench on the insulator layer 422 to complete the MOSFET 410. As is schematically shown in FIG. 8, the source region 414 of the MOSFET 410 is electrically connected to the base 442 of the BJT 440 via an electrical connection between the ohmic contact 415 and the ohmic contact 443. This may be accomplished, for example, using contact plugs and a conductive line (not shown in FIG. 8). The power SiC MGT 400 may operate in substantially the same fashion as the power SiC MGT 200 described above with reference to FIGS. 4-6.

Figure 9:
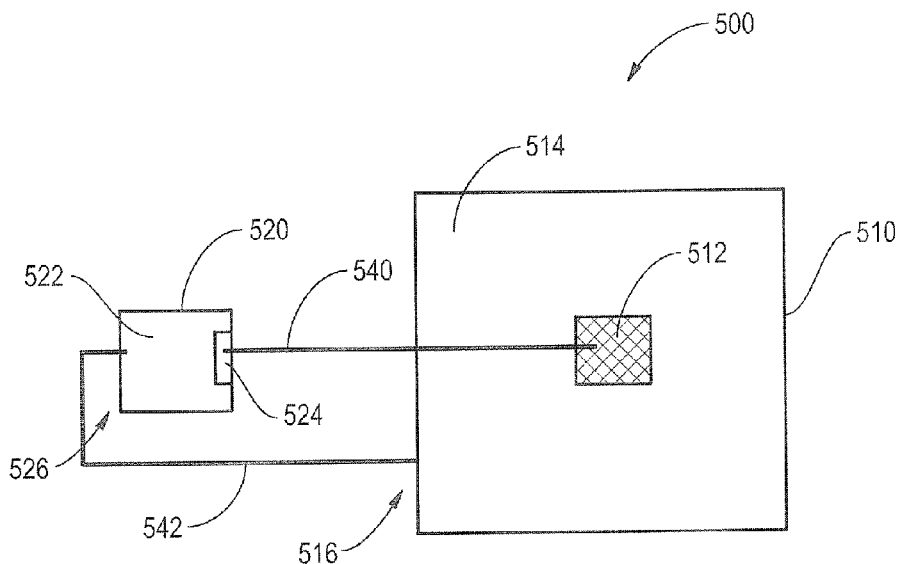
FIG. 9 is a schematic plan view of a 10 kV/10A SiC MGT that includes a discrete BJT and a discrete MOSFET according to further embodiments of the present invention.

Pursuant to further embodiments of the present invention, very high power SiC MGTs are provided that are formed as a discrete power SiC BJT that is driven by a discrete power SiC MOSFET that are arranged, for example, in a cascade configuration. Such an implementation is referred to as a "hybrid" device as compared to the monolithic devices 200 and 400 described above in which both the BJT and the MOSFET are fabricated in the same semiconductor chip and/or substrate. FIG. 9 schematically illustrates such a hybrid high power SiC MGT 500 according to embodiments of the present invention.

As shown in FIG. 9, the high power SiC MGT 500 includes a discrete SiC BJT 510 and a discrete SiC MOSFET 520, each of which are formed on separate substrates. A base 512 of the BJT 510 is surrounded by the emitter 514 of the BJT 510. The collector 516 of the BJT is located on the reverse side of the BJT 510 and hence is not visible in FIG. 9. The MOSFET 520 includes a gate electrode 522, a source region 524, and a drain region 526 (which is located on the reverse side of the MOSFET 520 and hence is not visible in FIG. 9). The source 524 of the MOSFET 520 is electrically connected to the base 512 of the BJT 510 by, for example, a wirebond 540. The drain 526 is electrically connected to the collector 516 of the BIT 510 by, for example, a wirebond 542.

While FIG. 9 illustrates a device that only includes a single power BJT 510, it will be appreciated that the MGT 500 of FIG. 9 may be modified to have an avalanche capability by forming at least some of the unit cells of the BJT to include both a standard BJT and an avalanche BJT.

Figure 10:
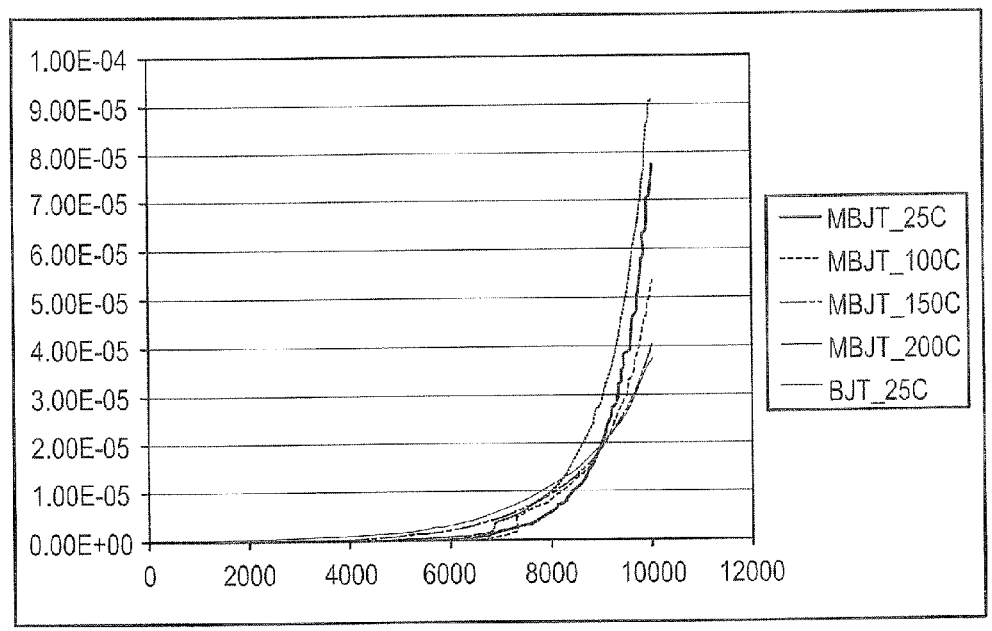
FIG. 10 is a graph illustrating the reverse I-V characteristics for a 10 kV/10A SiC MGT according to some embodiments of the present invention as a function of temperature.

FIG. 10 is a graph illustrating the reverse I-V characteristics (i.e., the collector current density $J_{CE}$ as a function of $V_{CE}$ when the 10 kV/10A SiC MGT is in its "off" state) for a 10 kV/10A SiC MGT according to some embodiments of the present invention as a function of temperature. As shown in FIG. 10, the reverse leakage currents are almost non-existent at applied forward voltages of less than 5,000 volts, and start to increase significantly at forward voltages of about 8,000 to 9,000 volts. Moreover, as the temperature of the device increases, the leakage current is reduced. This is in contrast to a 10 kV/10A power SiC MOSFET, which exhibits increased leakage currents with increasing temperature. FIG. 10 also shows the reverse I-V characteristics for a 10 kV/10A SiC BJT at 25° C. As can be seen from FIG. 10, the 10 kV/10A SiC BJT and the 10 kV/10A SiC MGT have similar reverse I-V characteristics at 25° C.

Pursuant to certain embodiments of the present invention, the area ratio of the output SiC BJT transistor as compared to the driver SiC MOSFET transistor may be approximately 10:1. However, embodiments of the present invention may have area ratios of about 7:1 to about 13:1.

Typically, high power SiC MOSFETs are operated at relatively low gate voltages (e.g., about 2-3 volts to 5 volts). Such lower gate voltages may be preferred for two reasons. First, at higher gate voltages (e.g., 16 volts), significant stress may be placed on the gate insulation layer of the MOSFET, which can cause the gate insulation layer to deteriorate over time. Such deterioration can eventually lead to device failure. Second, the transconductance of a high power SiC MOSFET decreases with increasing gate voltage. As noted above, the switching speed of the device may be a function of the transconductance. Thus, high power SiC MOSFETs may be operated at lower gate voltages (e.g., about 2-3 volts to 5 volts) in order to improve the switching speed of the device.

With the SiC MGTs according to embodiments of the present invention, the transconductance of the device is the product of the transconductance of the driver SiC MOSFET and the current gain of the output SiC BJT. Accordingly, the MGTs according to embodiments of the present invention may be operated at significantly higher gate voltages while still providing satisfactory transconductance. Moreover, the gate electrode on a 10 kV/1A SiC MOSFET will typically be more robust than the gate electrode on a 10 kV/10A SiC MOSFET. As such, the SiC MGTs according to embodiments of the present invention may generally be operated at higher gate voltages than a corresponding very high power SiC MOSFET. Thus, the MGTs according to embodiments of the present invention may be designed to operate at gate voltages in the range of, for example, about 5 volts to about 16 volts. Thus, the MGTs according to embodiments of the present invention may be easier to fabricate since they need not operate at gate voltages below, for example, about 5 volts (and fabricating SiC MOSFETs that operate at such gate voltages may be difficult), and as they will support higher output currents given their operation at a higher range of gate voltages.

The maximum output current of a power SiC MOSFET is proportional to the size of the gate area of the device. As such, to achieve larger output currents, it is generally necessary to increase the size of the gate area. According to embodiments of the present invention, very high power SiC MGTs are provided. The output current of these devices is a function of the input current supplied by the driver SiC MOSFET and the current gain of the SiC BJT. Since this current gain may be a factor of, for example, ten or more, the driver SiC MOSFET need not support nearly as high output currents, and hence the gate area of the driver SiC MOSFET may be significantly less than the gate area of a comparable very high power SiC MOSFET.

In particular, as shown above, some embodiments of the present invention may provide 10 kV/10A SiC MGTs which have a gate area on the order of, for example, one tenth the gate area of a comparable 10 kV/10A power SiC MOSFET. As a result, the manufacturing yield may be increased significantly as compared to 10 kV/10A power SiC MOSFET. Moreover, the 10 kV/10A SIC MGTs according to embodiments of the present invention may operate at forward voltages that are about the same as, or even less than, the operating forward voltage of a comparable 10 kV/10A power SiC MOSFET, and hence may provide at least comparable performance, making 10 kV/10A SIC MGTs according to some embodiments of the present invention attractive for high power, high temperature applications, such as power switching devices. The very high power SiC MGTs according to embodiments of the present invention may also exhibit superior reverse leakage current characteristics, particularly at higher temperatures, as the SiC MGTs exhibit reduced leakage currents with increasing temperature. Additionally, while the driver MOSFETs of the MGTs according to embodiments of the present invention may have relatively low channel mobilities, these lower channel mobilities do not adversely effect the performance of the device as it is the BJT as opposed to the MOSFET that supplies the output current of the device.

The very high power SiC MGTs according to embodiments of the present invention may also exhibit significantly higher transconductance (i.e., the change in output current divided by the change in gate voltage) as compared to 10 kV/10A SiC MOSFET devices, as the transconductance of the SiC MGT is the product of the transconductance of the driver SiC MOSFET and the current gain of the output SiC BJT. This can be seen, for example, in FIG. 3 above, as an increase in the gate voltage of the SiC MGT provides a significantly larger increase in the collector current density as compared to the increase in collector current density achieved for the same increase in the gate voltage of the SiC MOSFET. As a result of this higher transconductance, the switching speeds of the very high power SiC MGTs according to embodiments of the present invention may exceed the switching speeds of comparable very high power SiC MOSFET devices.

While the above embodiments are described with reference to particular figures, it is to be understood that some embodiments of the present invention may include additional and/or intervening layers, structures, or elements, and/or particular layers, structures, or elements may be deleted. More generally, the foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A high power wide band-gap MOSFET-gated bipolar junction transistor ("MGT"), comprising:
    a first wide band-gap bipolar junction transistor ("BJT") having a first collector, a first emitter and a first base;
    a wide band-gap MOSFET having a source region that is configured to provide a current to the base of the first wide band-gap BJT; and
    a second wide band-gap BJT having a second collector that is electrically connected to the first collector, a second emitter that is electrically connected to the first emitter, and a second base that is electrically connected to the first base so that the second wide band-gap BJT is connected in parallel to the first wide band-gap BJT,
    wherein the second base is thinner than the first base.

2. The high power wide band-gap MGT of claim 1, wherein the first and second wide band-gap BJTs are on a substrate, wherein a drift region is provided on the substrate, and wherein a distance between the first emitter and the drift region exceeds the distance between the second emitter and the drift region.

3. The high power wide band-gap MGT of claim 1, wherein a breakdown voltage of the high power wide band-gap MGT exceeds at least 5,000 volts.

4. The high power wide band-gap MGT of claim 1, wherein the first and second wide band-gap BJTs and the wideband MOSFET each comprise silicon carbide ("SiC") devices.

5. The high power wide band-gap MGT of claim 1, wherein the second BJT provides a non-destructive avalanche current path within an active area of the MGT.

6. The high power wide band-gap MGT of Claim 1, wherein a maximum thickness of the drift region is at least 1.2 times a maximum thickness of the first base.

7. The high power wide band-gap MGT of claim 1, wherein the device is configured so that the minority carrier injection from the first emitter into the first base exceeds the minority carrier injection from the first collector into the first base when the MGT is turned on.

8. The high power wide band-gap MGT of claim 1, further comprising a tunnel diode between the source and the drain of the wide band-gap MOSFET.

9. The high power wide band-gap MGT of claim 1, wherein the first and second wide band-gap BJTs and the wide band-gap MOSFET form a unit cell, the high power wide band-gap MGT including a plurality of additional unit cells, wherein the unit cell and the plurality of additional unit cells are electrically connected in parallel.

10. The high power wide band-gap MGT of claim 9, wherein only some of the plurality of additional unit cells include two BJTs.

11. The high power wide band-gap MGT of claim 10, wherein at least 75% of the plurality of additional unit cells include only a single BJT.

12. The high power wide band-gap MGT of claim 1, wherein the first emitter of the first wide band-gap BJT is electrically connected to the second emitter of the second wide band-gap BJT via a conductive path external to the first and second wide band-gap BJTs.

13. The high power wide band-gap MGT of claim 1, wherein the second wide-gap BJT has a different emitter-base junction to collector-base junction separation than the first wide band-gap BJT.

14. The high power wide band-gap MGT of claim 1, wherein the second wide-gap BJT provides a non-destructive leakage current path.

15. A high power wide band-gap MOSFET-gated bipolar junction transistor ("MGT"), comprising:
a first silicon carbide ("SiC") bipolar junction transistor ("BJT") having a collector, an emitter and a base;
a first SiC MOSFET having a source region that is configured to provide a current to the base of the SiC BJT; and
a second SiC BJT in parallel with the first SiC BJT, wherein the second SiC BJT provides a non-destructive avalanche current path within an active area of the MGT.

16. The high power wide band-gap MGT of claim 15, wherein a breakdown voltage of the MGT exceeds at least 5,000 volts.

17. The high power MGT of claim 16, wherein a source of the SiC MOSFET is configured to provide a current to the base of the first SiC BJT and a drain of the SiC MOSFET is electrically connected to the collector of the first SiC BJT.

18. The high power wide band-gap MGT of claim 16, wherein the base of the first SiC BJT is thinner than a base of the second SiC BJT.

19. The high power wide band-gap MGT of claim 16, wherein the wide band-gap MOSFET is the only transistor directly coupled to the base of the first SiC and to the base of the second SiC BJT.

20. The high power wide band-gap MGT of claim 16, wherein the MGT supports collector current densities of at least 30 A/cm$^2$.

21. The high power wide band-gap MGT of claim 20, wherein the SiC substrate comprises an n-type SiC substrate, wherein the first SiC BJT comprises an n-p-n BJT that has an n-type drift layer, wherein the base layer is a p-type base layer, wherein the SiC MOSFET comprises an n-MOSFET that includes an n-type drain region, and wherein the source region comprises an n-type source region that is spaced apart from the n-type drain region.

22. The high power wide band-gap MGT of claim 16, further comprising:
a SiC substrate of a first conductivity type, wherein the substrate includes the collector of the first SiC BJT thereon;
a drift layer of the first conductivity type on the SiC substrate opposite the collector;
a base layer of a second conductivity type that is opposite the first conductivity type, the base layer provided on the drift layer opposite the SiC substrate,
an emitter layer of the first conductivity type on the base layer opposite the drift layer,
wherein the base of the first SiC BJT is part of the base layer, and
wherein the collector of the first SiC BJT is electrically connected to the n-type drain region.

23. The high power wide band-gap MGT of claim 16, wherein the SiC MOSFET is configured to operate at a gate voltage of between about 5 volts and about 16 volts.

24. The high power wide band-gap MGT of claim 15, wherein an emitter of the first SiC BJT is electrically connected to an emitter of the second SiC BJT via a conductive path external to the first and second SiC BJTs.

25. A high power wide band-gap MOSFET-gated bipolar junction transistor ("MGT"), comprising:
an n-type bulk single crystal silicon carbide ("SiC") substrate;
an n-type SiC drift layer on the n-type conductivity bulk single crystal SiC substrate, the n-type drift layer having a first carrier concentration that is less than a second carrier concentration of the n-type SiC substrate;
a patterned p-type SiC layer in the n-type SiC drift layer, the patterned p-type SiC layer including a base region and a source isolation region that includes a channel region that is spaced-apart from the base region;
a patterned n-type SiC layer in the patterned p-type SiC layer, the patterned n-type SiC layer including a source region that is located in the source isolation region of the patterned p-type SiC layer and an emitter region in the base region of the patterned p-type SiC layer;
an insulating layer on the source region, the channel region, and the n-type drift layer;
a gate electrode on the insulating layer; and
a collector contact on a surface of the SiC substrate opposite the n-type drift layer;
an emitter contact on the emitter region of the patterned n-type SiC layer,
wherein the source region is electrically connected to the base region,
wherein the MGT further includes a second emitter region, and wherein the second emitter region extends deeper into the base region than does the first emitter region, and
wherein a breakdown voltage of the MGT exceeds at least 5,000 volts.

* * * * *

UNITED STATES PATENT AND TRADEMARK OFFICE
CERTIFICATE OF CORRECTION

PATENT NO. : 8,541,787 B2  
APPLICATION NO. : 12/503430  
DATED : September 24, 2013  
INVENTOR(S) : Zhang Page 1 of 1

It is certified that error appears in the above-identified patent and that said Letters Patent is hereby corrected as shown below:

On Title Page:  
Item 56, Page 6, References Cited, Other Publications, right column:  
    correct "Tang Yet al.,"  
    to read -- Tang Y et al., --

In the Specification:  
Column 10, Line 56: correct "provide an $p^-$ layer on"  
    to read -- provide an $n^-$ layer on --

Column 11, Line 23: correct "then drift region 304."  
    to read -- the $n^-$ drift region 304. --

Column 13, Line 8: correct "An SiC layer is"  
    to read -- An $n^+$ SiC layer is --

Column 13, Line 20: correct "An SiC layer is"  
    to read -- An $n^+$ SiC layer is --

Signed and Sealed this  
Twenty-third Day of September, 2014

Michelle K. Lee  
*Deputy Director of the United States Patent and Trademark Office*